United States Patent
Lee

(10) Patent No.: US 8,575,586 B2
(45) Date of Patent: Nov. 5, 2013

(54) RESISTIVE MEMORY DEVICE AND METHOD FOR MANUFACTURING THE SAME

(75) Inventor: Yu-Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 768 days.

(21) Appl. No.: 12/411,128

(22) Filed: Mar. 25, 2009

(65) Prior Publication Data

US 2010/0019219 A1 Jan. 28, 2010

(30) Foreign Application Priority Data

Jul. 24, 2008 (KR) .................. 10-2008-0072475

(51) Int. Cl.
*H01L 29/68* (2006.01)

(52) U.S. Cl.
USPC ........................... 257/4; 257/E29.17

(58) Field of Classification Search
USPC ............... 257/4, E27.004, E29.17; 365/100
See application file for complete search history.

(56) References Cited

U.S. PATENT DOCUMENTS

| 2004/0159868 A1* | 8/2004 | Rinerson et al. | 257/295 |
| 2005/0019975 A1* | 1/2005 | Lee et al. | 438/95 |
| 2006/0291268 A1* | 12/2006 | Happ et al. | 365/103 |
| 2007/0267667 A1* | 11/2007 | Ufert | 257/295 |

FOREIGN PATENT DOCUMENTS

| KR | 1020040085529 A | 10/2004 |
| KR | 1020060120463 A | 11/2006 |
| KR | 1020080000358 A | 1/2008 |
| KR | 1020080064353 A | 7/2008 |

OTHER PUBLICATIONS

Notice of Allowance issued from Korean Intellectual Property Office on Apr. 29, 2010.

* cited by examiner

*Primary Examiner* — Colleen Matthews
(74) *Attorney, Agent, or Firm* — IP & T Group LLP

(57) ABSTRACT

A resistive memory device and a method for manufacturing the same are disclosed. The resistive memory device includes a lower electrode formed over a substrate, a resistive layer disposed over the lower electrode, an upper electrode formed over the resistive layer, and an oxygen-diffusion barrier pattern provided in an interface between the resistive layer and the upper electrode. The above-described resistive memory device and a method for manufacturing the same may prevent the out diffusion of oxygen in the interface of the upper electrode to avoid set-stuck phenomenon occurring upon the operation of the resistive memory device, thereby improving the endurance of the resistive memory device.

13 Claims, 1 Drawing Sheet

RESISTIVE MEMORY DEVICE AND METHOD FOR MANUFACTURING THE SAME

CROSS-REFERENCE TO RELATED APPLICATIONS

The present invention claims priority of Korean patent application number 10-2008-0072475, filed on Jul. 24, 2008, respectively, which is incorporated by reference in its entirety.

BACKGROUND OF THE INVENTION

The present invention relates to a technology of manufacturing a semiconductor device, and more particularly, to a resistive memory device which utilizes a change in resistance, such as in nonvolatile Resistive Random Access Memory (ReRAM) devices, and a method for manufacturing the same.

Recently, researchers are actively studying next-generation semiconductor memory devices which can replace Dynamic Random Access Memory (DRAM) and flash memory.

One of such next-generation semiconductor memory devices is a resistive memory device utilizing a material whose resistance changes rapidly according to an applied bias to switch between at least two different resistance states, that is, a resistive layer. As a resistive layer having such characteristics, binary oxide including transition metal oxide or perovskite-based material has been used.

The structure of the resistive memory device and its switching mechanism are briefly described hereinafter.

Generally, a resistive memory device has a structure including upper and lower electrodes and a resistive layer located between the upper and lower electrodes. When a predetermined bias is applied to the upper and lower electrodes, a filamentary current path may be generated due to oxygen vacancies in the resistive layer, or the generated filamentary current path may disappear following the elimination of the generated oxygen vacancies. The resistive layer represents two resistive states which are distinguished from each other due to the generation or elimination of the filamentary current path. That is, when the filamentary current path is generated, a state where resistance is low, that is, a set state, is formed, and when the filamentary current path is eliminated, a state where resistance is high, that is, a reset state, is formed.

However, repeated write/erase operations of the resistive memory device may cause a set-stuck phenomenon, in which it is impossible to return from a set state to a reset state. In order to return from the set state to the reset state, it is required to fill oxygen vacancies with oxygen of an upper electrode interface to eliminate the filamentary current path. However, since the oxygen of the upper electrode interface is diffused out as time passes, the oxygen around the upper electrode interface becomes insufficient.

As a result, the resistive memory device is weak with respect to an endurance of framework, and this property makes it difficult to substantially utilize the resistive memory device as a memory device.

SUMMARY OF THE INVENTION

Embodiments of the present invention are directed to providing a resistive memory device which can prohibit the out diffusion of oxygen in the interface of the upper electrode to prevent set-stuck phenomenon occurring upon the operation of the resistive memory device and thereby improving the endurance of the resistive memory device, and a method for manufacturing the same.

In accordance with an aspect of the present invention, there is provided a resistive memory device, which includes: a lower electrode formed over a substrate, a resistive layer disposed over the lower electrode, an upper electrode formed over the resistive layer, and an oxygen-diffusion barrier pattern provided in an interface between the resistive layer and the upper electrode.

In accordance with another aspect of the present invention, there is provided a method of manufacturing a resistive memory device, which includes: forming a lower electrode over a substrate, forming a resistive layer over the lower electrode, forming an oxygen-diffusion barrier pattern over the resistive layer, and forming an upper electrode over the resistive layer having the oxygen-diffusion barrier pattern.

DESCRIPTION OF SPECIFIC EMBODIMENTS

Other objects and advantages of the present invention can be understood by the following description, and become apparent with reference to the embodiments of the present invention. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Embodiments of the invention are described hereinafter with reference to the accompanying drawings.

Figure 1A:
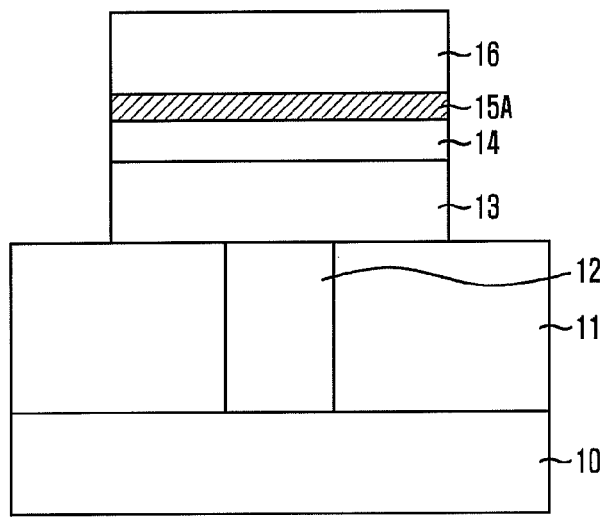
FIG. 1A is a cross-sectional view showing a resistive memory device and a method for manufacturing the same according to a first embodiment of the present invention.
Figure 1B:
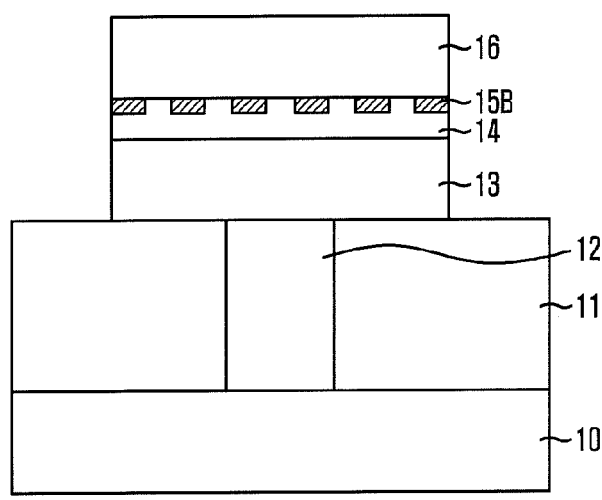
FIG. 1B is a cross-sectional view showing a resistive memory device and a method for manufacturing the same according to a second embodiment of the present invention.

As shown in FIGS. 1A and 1B, the resistive memory devices according to first and second embodiments include, individually, a substrate 10 with predetermined lower structures formed therein, an insulating film 11 over the substrate 10, a contact plug 12 which passes through the insulating film 11 and is subsequently connected to the substrate 10, a lower electrode which is located over the insulating film 11 and covers the contact plug 12, a resistive layer 14 over the lower electrode 13 and a upper electrode 16 over the resistive layer 14. In this case, the resistive layer 14 is formed of a binary oxide, such as MgO, ZnO, $TiO_2$, NiO, $SiO_2$, $Nb_2O_5$, $HfO_2$ or the like, or perovskite-based material. Furthermore, the lower electrode 13 or the upper electrode 14 may be a metal film such as Ni, Co, Ti, Al, Au, Pt, Ta, Cr, Ag or the like.

In this case, oxygen-diffusion barrier patterns 15A and 15B for protecting oxygen-diffusion are provided over an interface between the resistive layer 14 and the upper electrode 16. The oxygen-diffusion barrier patterns 15A and 15B are formed of a material whose combination with oxygen is strong, and may be formed of metal, such as Ti, Ni, Co, Al, Au, Ag, Pt or Tg. Furthermore, the oxygen-diffusion barrier pattern 15A may have a thin film-type oxygen-diffusion barrier pattern as shown in FIG. 1A, or the oxygen-diffusion barrier pattern 15B may have a dot-type oxygen-diffusion barrier pattern as shown in FIG. 1B. A plurality of dot-type oxygen-diffusion barrier patterns 15B are disposed apart from each other, and may be disposed in such a manner that their intervals are substantially uniform.

The operation of the resistive memory device in which oxygen-diffusion barrier patterns 15A and 15B are provided over the interface between the resistive layer 14 and the upper electrode 16, is briefly described hereinafter.

In a procedure of performing a set process of applying a predetermined bias to the lower and upper electrodes 13 and 16 of the resistive memory device, thereby generating a filament current path within the resistive layer 14 due to oxygen vacancies, the oxygen within the resistive layer 14 is combined with the oxygen-diffusion barrier patterns 15A and 15B.

On the other hand, in a procedure of performing a reset process of applying another predetermined bias, which is different from the predetermined bias of the set process, to the lower and upper electrodes 13 and 16 of the resistive memory device to thereby eliminate the filament current path within the resistive layer 14 due to oxygen vacancies, the oxygen combined with the oxygen-diffusion barrier patterns 15A and 15B fills the preformed oxygen vacancies to thereby eliminate the filament current path. That is, the oxygen-diffusion barrier patterns 15A and 15B serve as oxygen reservoirs to facilitate the reset process and prevent a set-stuck phenomenon. Particularly, in the case of using the dot-type oxygen-diffusion barrier pattern 15B, since the oxygen vacancies fill a location where the oxygen-diffusion barrier pattern 15B exists, there is an advantage in that the characteristics of the reset process is uniform compared to the case of using the thin film-type oxygen-diffusion barrier pattern 15A. Furthermore, as described above, in the case that a plurality of dot-type oxygen-diffusion barrier patterns 15B are disposed, it is possible to facilitate the reset process and further to make the characteristics of the reset process more uniform when their intervals are uniform.

The method of manufacturing the resistive memory device according to the first embodiment of the present invention is described hereinafter with reference to FIG. 1A.

As shown in FIG. 1A, an insulating film 11 is formed over a substrate 10 with a predetermined lower structure, and a contact plug 12 which is connected to the substrate 10 through the insulating film 11 is formed.

Then, the lower electrode 13 which covers the contact plug 12 is formed over the insulating film 11, and the resistive layer 14 is then formed over the lower electrode 13.

Subsequently, a thin film-type oxygen-diffusion barrier pattern 15A is formed by depositing a metal film over the resistive layer 14. In this case, the deposition thickness of the metal thin film may range from approximately 10 Å to approximately 200 Å.

Subsequently, an upper electrode 16 is formed over the thin film-type oxygen-diffusion barrier pattern 15A.

A method of manufacturing a resistive memory device according to a second embodiment of the present invention is described hereinafter with reference to FIG. 1B.

As shown in FIG. 1B, an insulating film 11 is formed over a substrate 10 with a predetermined lower structure, and then the contact plug 12 which is connected to the substrate 10 through the insulating film 11 is formed.

Then, a lower electrode 13 which covers the contact plug 12 is formed over the insulating film 11, and a resistive layer 14 is formed over the lower electrode 13.

Then, a metal thin film is deposited on the resistive layer 14, with respect to which a thermal processing is then performed. As a result of the performance of the thermal processing, the metal thin film coagulates in a form of dot. As a result, a dot-type oxygen-diffusion barrier pattern 15B is formed over the resistive layer 14. In this case, the deposition thickness of the metal thin film may range from approximately 10 Å to approximately 200 Å, and the temperature of the thermal processing may range from approximately 800 Å to approximately 900 Å.

Subsequently, an upper electrode 16 is formed over the resistive layer 14 with the dot-type oxygen-diffusion barrier pattern 15B.

In the resistive memory device and method for manufacturing the same according to the embodiments of the present invention, the out-diffusion of oxygen in the interface of the upper electrode is avoided to prevent set-stuck phenomenon occurring upon the operation of the resistive memory device, thereby improving the endurance of the resistive memory device.

While the present invention has been described with respect to the specific embodiments, it will be apparent to those skilled in the art that various changes and modifications may be made without departing from the spirit and scope of the invention as defined in the following claims.

What is claimed is:

1. A resistive memory device, comprising:
   a lower electrode formed over a substrate;
   a resistive layer disposed over the lower electrode;
   an upper electrode formed over the resistive layer; and
   an oxygen-diffusion barrier pattern formed between the resistive layer and the upper electrode,
   wherein the oxygen-diffusion barrier pattern is formed to be buried in the resistive layer at an upper surface of the resistive layer and is formed of a metal material, and the upper surface of the resistive layer forms a contact area between the upper electrode and the oxygen-diffusion barrier pattern.

2. The resistive memory device of claim 1, wherein the oxygen-diffusion barrier pattern has a dot-type oxygen-diffusion barrier pattern.

3. The resistive memory device of claim 2, wherein the dot-type oxygen-diffusion barrier pattern includes a plurality of dot-type patterns which are disposed apart from each other.

4. The resistive memory device of claim 3, wherein the intervals between the dot-type patterns are substantially uniform.

5. The resistive memory device of claim 1, wherein the metal material is Ti, Ni, Co, Al, Au, Ag, Pt or Ta.

6. The resistive memory device of claim 1, wherein the resistive layer is a binary oxide or a perovskite-based material.

7. The resistive memory device of claim 1, wherein the oxygen-diffusion barrier pattern is configured to fill pre-generated oxygen vacancies with oxygen according to a bias applied to the lower and upper electrodes.

8. The resistive memory device of claim 1, wherein the metal material serves as oxygen reservoirs in response to a bias applied to the lower and upper electrodes.

9. A resistive memory device, comprising:
   a lower electrode formed over a substrate;
   a resistive layer disposed over the lower electrode;
   an upper electrode formed over the resistive layer; and
   an oxygen-diffusion barrier pattern formed between the resistive layer and the upper electrode, wherein the oxygen-diffusion barrier pattern is buried in the resistive layer at an upper surface of the resistive layer and is formed of a metal material, the resistive layer is formed of a perovskite-based material, and the upper surface of the resistive layer forms a contact area between the upper electrode and the oxygen-diffusion barrier pattern.

10. The resistive memory device of claim 9, wherein the oxygen-diffusion barrier pattern has a thin film-type oxygen-diffusion barrier pattern.

11. The resistive memory device of claim 9, wherein the metal material is Ti, Ni, Co, Al, Au, Ag, Pt or Ta.

12. The resistive memory device of claim 9, wherein the oxygen-diffusion barrier pattern is configured to fill pre-generated oxygen vacancies with oxygen according to a bias applied to the lower and upper electrodes.

13. The resistive memory device of claim 9, wherein the metal material serves as oxygen reservoirs in response to a bias applied to the lower and upper electrodes.

* * * * *